(12) United States Patent
Hausrath et al.

(10) Patent No.: US 11,339,083 B2
(45) Date of Patent: May 24, 2022

(54) LOW DIELECTRIC GLASS COMPOSITION, FIBERS, AND ARTICLE

(71) Applicant: AGY Holding Corporation, Aiken, SC (US)

(72) Inventors: Robert Lurie Hausrath, Aiken, SC (US); Anthony Vincent Longobardo, Johnston, SC (US)

(73) Assignee: AGY HOLDING CORPORATION, Aiken, SC (US)

( * ) Notice: Subject to any disclaimer, the term of this patent is extended or adjusted under 35 U.S.C. 154(b) by 330 days.

(21) Appl. No.: 16/732,825

(22) Filed: Jan. 2, 2020

(65) Prior Publication Data
US 2020/0216351 A1   Jul. 9, 2020

Related U.S. Application Data

(63) Continuation-in-part of application No. 16/474,287, filed as application No. PCT/US2017/067785 on Dec. 21, 2017, now Pat. No. 10,562,810.

(60) Provisional application No. 62/439,755, filed on Dec. 28, 2016.

(51) Int. Cl.
*C03C 3/097* (2006.01)
*C03C 13/00* (2006.01)
*C03C 3/087* (2006.01)
*H05K 1/03* (2006.01)

(52) U.S. Cl.
CPC ............. *C03C 3/097* (2013.01); *C03C 3/087* (2013.01); *C03C 13/00* (2013.01); *H05K 1/0306* (2013.01); *H05K 1/0366* (2013.01); *C03C 2203/10* (2013.01); *C03C 2213/00* (2013.01)

(58) Field of Classification Search
CPC ......... C03C 13/00; C03C 3/087; C03C 3/091; C03C 3/097; H05K 1/0306; H05K 1/0366
See application file for complete search history.

(56) References Cited

U.S. PATENT DOCUMENTS

| | | |
|---|---|---|
| 5,958,808 A | 9/1999 | Mori et al. |
| 6,309,990 B2 | 10/2001 | Tamura et al. |
| 6,846,761 B2 | 1/2005 | Tamura |
| 8,679,993 B2 | 3/2014 | Sawanoi et al. |
| 2003/0054936 A1 ‡ | 3/2003 | Tamura .................. C03C 3/118 501/35 |
| 2004/0175557 A1 | 9/2004 | Creux |
| 2006/0287185 A1 ‡ | 12/2006 | Creux .................. H05K 1/0366 501/36 |
| 2011/0281484 A1 | 11/2011 | Yoshida et al. |

FOREIGN PATENT DOCUMENTS

| | | | | |
|---|---|---|---|---|
| CN | 101269915 A | * | 9/2008 | ............. C03C 13/00 |
| CN | 102503153 B | ‡ | 10/2013 | ............. C03C 3/091 |
| CN | 102503153 B | | 10/2013 | |
| CN | 103351102 B | | 3/2016 | |
| JP | 2010260781 A | | 11/2010 | |
| JP | 201698118 A | | 5/2016 | |
| WO | 2010011701 A2 | | 1/2010 | |
| WO | WO-2010011701 A2 | ‡ | 1/2010 | ............. C03C 13/00 |
| WO | WO-2018125736 A1 | * | 7/2018 | ............. C03C 3/097 |

OTHER PUBLICATIONS

Olsen, Kaj K.; The International Preliminary Report on Patentability (Chapter II of Patent Cooperation Treaty); PCT/US17/67785; The Preliminary Examining Authority; 6 pages; dated Feb. 11, 2019 (completion date).‡
Young, Lee W.; The International Search Report and Written Opinion; PCT/US17/67785; The International Searching Authority; 9 pages; dated Feb. 14, 2018 (completion date).‡
Young, Lee W.; The International Search Report and Written Opinion; PCT/US17/67785; The International Searching Authority; 9 pages dated Feb. 14, 2018 (Completion date) Feb. 14, 2018.
Olsen, Kaj K.; The International Preliminary Report on Patentability (Chapter II of Patent Cooperation Treaty); PCT/US17/67785; The Preliminary Examining Authority; 6 pages; dated Feb. 11, 2019 (Completion Date) Feb. 11, 2019.

* cited by examiner
‡ imported from a related application

*Primary Examiner* — Elizabeth A. Bolden
(74) *Attorney, Agent, or Firm* — Todd A. Serbin; Nexsen Pruet, LLC

(57) ABSTRACT

Glass compositions and glass fibers having low dielectric constants and low dissipation factors that may be suitable for use in electronic applications and articles are disclosed. The glass fibers and compositions of the present invention may include between 48.0 to 57.0 weight percent $SiO_2$; between 15.0 and 26.0 weight percent $B_2O_3$; between 12.0 and 18.0 weight percent $Al_2O_3$; between 3.0 and 8.0 weight percent $P_2O_5$; between 0.25 and 7.00 weight percent CaO; 5.0 or less weight percent MgO; and 6.0 or less weight percent $TiO_2$. Further, the glass composition has a glass viscosity of 1000 poise at a temperature greater than 1350 degrees Celsius and a liquidus temperature greater than 1100 degrees Celsius.

19 Claims, 1 Drawing Sheet

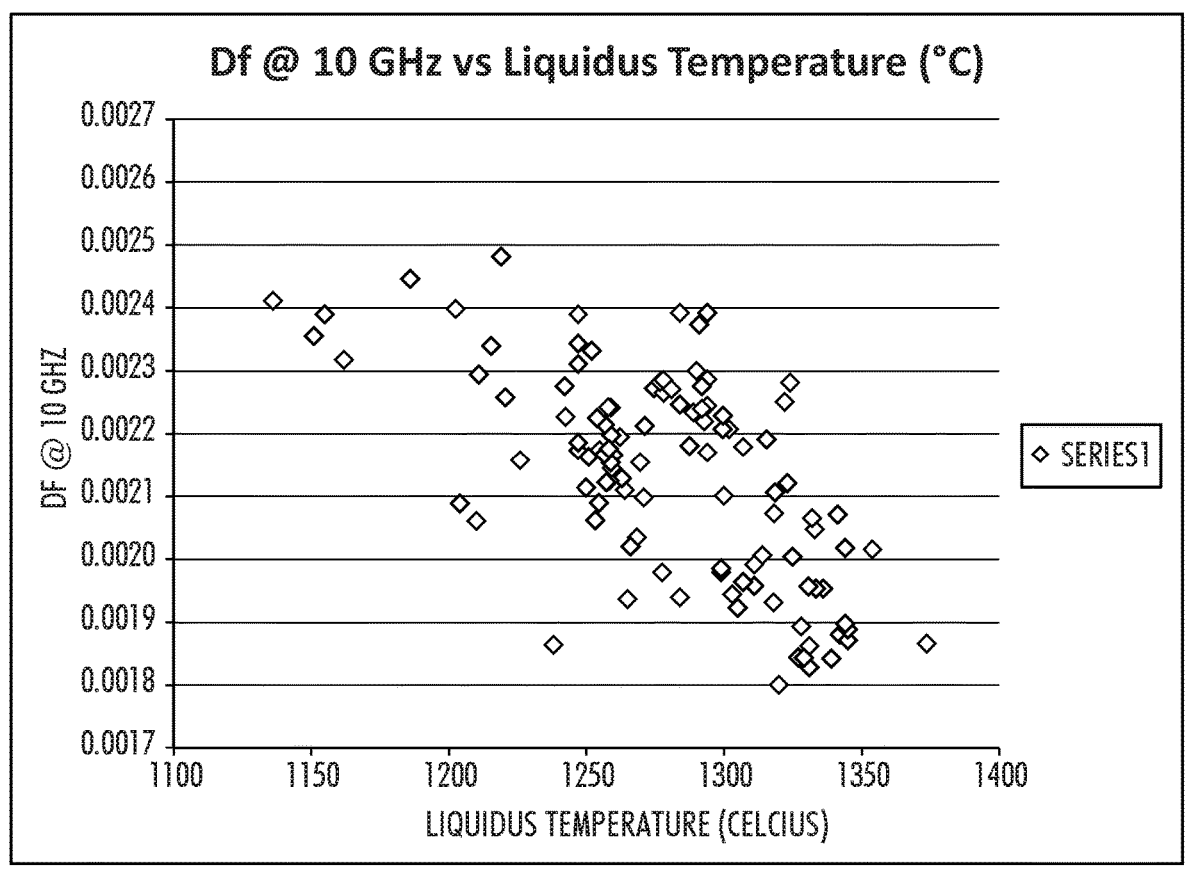

LOW DIELECTRIC GLASS COMPOSITION, FIBERS, AND ARTICLE

RELATED APPLICATIONS

This application is a continuation-in-part, and claims the benefit of priority under 35 U.S.C. § 120 of pending U.S. patent application Ser. No. 16/474,287 filed Jun. 27, 2019, which is a U.S. National Phase application of PCT Patent Application No. PCT/US2017/067785, having International filing date of Dec. 21, 2017, and which claims the benefit of priority under 35 U.S.C. § 119(e) of U.S. Provisional Patent Application No. 62/439,755 filed Dec. 28, 2016. The contents of the above applications are all incorporated by reference as if fully set forth herein in their entireties.

FIELD OF INVENTION

The present invention relates to glass compositions and fibers. More particularly, the present invention relates to glass compositions and fibers having a low dielectric constant and a low dissipation factor. Further, the glass fibers of the present invention are preferably suitable for use in connection with electronic related devices such as reinforcement for printed circuit board laminates and the like.

BACKGROUND

Modern electronic devices commonly include printed circuit boards reinforced with glass fibers. Many modern electronic devices, such as mobile or stationary wireless telephones, computers, smartphones, tablets, and the like, have electronic systems that operate at high processing speeds and high or ultra-high frequencies. When glass is exposed to such a high or ultra-high frequency electromagnetic field, the glass absorbs at least some energy and converts the absorbed energy to heat. The energy that is converted by the glass into heat is called dielectric loss energy. This dielectric loss energy is proportional to the "dielectric constant" and the "dielectric loss tangent" of the glass composition, as indicated by the following expression:

$$W = k \cdot f \cdot v^2 \cdot \varepsilon \cdot (\tan \delta)$$

In the above expression, "W" is the dielectric loss energy in the glass, "k" is a constant, "f" is the frequency, "$v^2$" is the potential gradient, "$\varepsilon$" is the dielectric constant, and "tan $\delta$" is the dielectric loss tangent. The dielectric loss tangent (tan $\delta$) is dimensionless and is often referred to in the art by the following synonyms: "loss factor," or more commonly, "dissipation factor" (Df). As the above expression indicates, the dielectric loss energy "W" increases with an increase in the dielectric constant and the dielectric loss tangent (dissipation factor, Df) of the glass, and/or with an increase in frequency.

Two types of glass fibers commonly used to reinforce printed circuit boards are E-Glass and D-Glass. E-Glass, however, has a relatively high dielectric constant ranging from about 6.1 and a relatively high dissipation factor ranging from about $38 \times 10^{-4}$ at a frequency of about 10 GHz at room temperature. Accordingly, because E-Glass can yield relatively high dielectric losses, E-Glass is a poor reinforcement material for printed circuit boards having higher densities of electronic components and higher processing speeds. D-Glass, on the other hand, has a relatively low dielectric constant and dissipation factor. D-Glass, however, has relatively high melting temperatures, relatively poor workability, relatively poor mechanical performance, and relatively poor water resistance. In addition, D-Glass may inadequately adhere to epoxy resins, and commonly includes imperfections in the form of striae and bubbles. Accordingly, neither E-Glass nor D-Glass are ideally suited for use as reinforcement fibers in high speed printed circuit boards, and neither is well-suited for circuit boards that operate at high or ultra-high frequencies from about 100 MHz to about 18 GHz.

Previous attempts to provide glass formulations suited for electronics include, U.S. Pat. No. 5,958,808 to Mori, US2004/01755557 to Creux U.S. Pat. No. 6,309,990 to Tamura, U.S. Pat. No. 6,846,761 to Tamura, WO2010/011701 to Kuhn, US2011/0281484 to Yoshida, U.S. Pat. No. 8,679,993 to Sawanoi and CN103351102 to Zhang.

SUMMARY

In an aspect of the present invention, what is provided is a glass composition comprising: between 48.0 to 57.0 weight percent $SiO_2$; between 15.0 weight percent $B_2O_3$ and 26.0 weight percent $B_2O_3$; between 12.0 weight percent $Al_2O_3$ and 18.0 weight percent $Al_2O_3$; between 3.0 and 8.0 weight percent $P_2O_5$; between 0.25 weight percent and 7.0 weight percent CaO; 5.0 or less weight percent MgO; and, 6.0 or less weight percent $TiO_2$; wherein the composition has a glass viscosity of 1000 poise at a temperature greater than 1350° C., and wherein the composition has a liquidus temperature greater than 1100° C.

In an embodiment of the invention, the class composition further comprises: between 49.0 to 56.5 weight percent $SiO_2$; between 15.5 to 25.5 weight percent $B_2O_3$; between 12.5 to 17.50 weight percent $Al_2O_3$; between 3.0 and 7.5 weight percent $P_2O_5$; between 0.25 weight percent and 6.5 weight percent CaO; 4.5 or less weight percent MgO; and 5.5 or less weight percent $TiO_2$.

In an embodiment of the invention, the glass composition further comprises: between 50.0 to 56.0 weight percent $SiO_2$; between 16.0 to 25.0 weight percent $B_2O_3$; between 13.0 to 17.0 weight percent $Al_2O_3$; between 3.0 and 7.0 weight percent $P_2O_5$; between 0.25 and 6.0 weight percent CaO; 4.0 or less weight percent MgO; and 5.0 or less weight percent $TiO_2$.

In an embodiment of the invention, the composition further comprises one or more of: no less than 49.0 weight percent $SiO_2$; no more than 56.5 weight percent $SiO_2$; no less than 15.5 weight percent $B_2O_3$; no more than 25.5 weight percent $B_2O_3$; no more than 17.50 weight percent $Al_2O_3$; no more than 7.0 weight percent $P_2O_5$; 6.5 or less weight percent CaO; 4.5 or less weight percent MgO; and/or no more than 5.5 weight percent $TiO_2$.

In an embodiment of the invention, the composition further comprises one or more of: no less than 50.0 weight percent $SiO_2$; no more than 56.0 weight percent $SiO_2$; no less than 16.0 weight percent $B_2O_3$; no more than 25.0 weight percent $B_2O_3$; no more than 17.0 weight percent $Al_2O_3$; no more than 7.0 weight percent $P_2O_5$; 6.0 or less weight percent CaO; 4.0 or less weight percent MgO; and/or no more than 5.0 weight percent $TiO_2$.

In an embodiment of the invention, the composition has a liquidus temperature greater than 1100° C.

In an embodiment of the invention, the composition has a liquidus temperature greater than 1150° C.

In an embodiment of the invention, the composition has a liquidus temperature greater than 1200° C.

In an embodiment of the invention, the composition has a glass viscosity of 1000 poise at a temperature greater than 1355° C.

In an embodiment of the invention, the composition has a glass viscosity of 1000 poise at a temperature greater than 1360° C.

In an embodiment of the invention, a glass fiber is formed from the glass compositions described above.

In an embodiment of the invention, the glass fiber has a dielectric constant less than or equal to 6 and/or a dissipation factor less than or equal to $38 \times 10^{-4}$ at a frequency of 10 GHz at room temperature.

In an embodiment of the invention, the glass fiber has a dielectric constant less than or equal to 4.60 and/or a dissipation factor less than or equal to $30 \times 10^{-4}$ at a frequency of 10 GHz at room temperature.

In an embodiment of the invention, the glass fiber has a dielectric constant less than or equal to 4.55 and/or a dissipation factor less than or equal to $25 \times 10^{-4}$ at a frequency of 10 GHz at room temperature.

In an embodiment of the invention, the glass composition has an inherent network structure that is predisposed to crystalize into and form Alumino-Borate Mullite crystals.

In an embodiment of the invention, there is provided a process for providing continuous, manufacturable low dielectric glass fibers, the process comprising the steps of: providing any of the glass compositions described herein to a melting zone of a glass melter; heating the composition to a forming temperature in excess of the liquidus temperature; and continuously fiberizing said molten glass whereby a low dielectric constant and low dissipation factor glass fiber is produced.

In an aspect of the present invention, what is further provided is a low dielectric glass fiber formed from a glass composition comprising: between 48.0 to 57.0 weight percent $SiO_2$; between 15.0 to 26.0 weight percent $B_2O_3$; between 12.0 to 18.0 weight percent $Al_2O_3$; between 3.0 and 8.0 weight percent $P_2O_5$; between greater than 0.25 and 7.00 weight percent CaO; 5.0 or less weight percent MgO; and, 6.0 or less weight percent $TiO_2$; wherein the composition has a glass viscosity of 1000 poise at a temperature greater than 1350° C., and wherein the glass composition has a liquidus temperature greater than 1100° C.

In an embodiment of the invention, the glass composition further comprises: between 49.0 to 56.5 weight percent $SiO_2$; between 15.5 to 25.5 weight percent $B_2O_3$; between 12.5 to 17.50 weight percent $Al_2O_3$; between 3.0 and 7.5 weight percent $P_2O_5$; between 0.25 and 6.5 weight percent CaO; 4.5 or less weight percent MgO; and 5.5 or less weight percent $TiO_2$.

In an embodiment of the invention, the glass composition further comprises: between 50.0 to 56.0 weight percent $SiO_2$; between 16.0 to 25.0 weight percent $B_2O_3$; between 13.0 to 17.0 weight percent $Al_2O_3$; between 3.0 and 7.0 weight percent $P_2O_5$; between 0.25 and 6.0 weight percent CaO; 4.0 or less weight percent MgO; and, 5.0 or less weight percent $TiO_2$.

In an embodiment of the invention, the glass composition further comprises one or more of: no less than 49.0 weight percent $SiO_2$; no more than 56.5 weight percent $SiO_2$; no less than 15.5 weight percent $B_2O_3$; no more than 25.5 weight percent $B_2O_3$; no more than 17.50 weight percent $Al_2O_3$; no more than 7.0 weight percent $P_2O_5$; 6.5 or less weight percent CaO; 4.5 or less weight percent MgO; and/or, no more than 5.5 weight percent $TiO_2$.

In an embodiment of the invention, the glass composition further comprises one or more of: no less than 50.0 weight percent $SiO_2$; no more than 56.0 weight percent $SiO_2$; no less than 16.0 weight percent $B_2O_3$; no more than 25.0 weight percent $B_2O_3$; no more than 17.0 weight percent $Al_2O_3$; no more than 7.0 weight percent $P_2O_5$; 6.0 or less weight percent CaO; 4.0 or less weight percent MgO; and/or, no more than 5.0 weight percent $TiO_2$.

In an embodiment of the invention, the glass composition has a liquidus temperature greater than 1100° C.

In an embodiment of the invention, the glass composition has a liquidus temperature greater than 1150° C.

In an embodiment of the invention, the glass composition has a liquidus temperature greater than 1200° C.

In an embodiment of the invention, the glass composition has a glass viscosity of 1000 poise at a temperature greater than 1355° C.

In an embodiment of the invention, the glass composition has a glass viscosity of 1000 poise at a temperature greater than 1360° C.

In an embodiment of the invention, the glass fiber has a dielectric constant less than or equal to 6 and/or a dissipation factor less than or equal to $38 \times 10^{-4}$ at a frequency of 10 GHz at room temperature.

In an embodiment of the invention, the glass fiber has a dielectric constant less than or equal to 4.60 and/or a dissipation factor less than or equal to $30 \times 10^{-4}$ at a frequency of 10 GHz at room temperature.

In an embodiment of the invention, the glass fiber has a dielectric constant less than or equal to 4.55 and/or a dissipation factor less than or equal to $25 \times 10^{-4}$ at a frequency of 10 GHz at room temperature.

In an embodiment of the invention, the glass fiber is formed from a glass composition which has an inherent network structure that is predisposed to crystalize into and form Alumino-Borate Mullite crystals.

The present invention also includes a fiberglass reinforced article, such as a printed circuit board, incorporating glass fibers of the present invention. Further, the present invention includes a product incorporating a glass fiber, such as disclosed above, and wherein the product may be a printed circuit board, a woven fabric, a non-woven fabric, a unidirectional fabric, a chopped strand, a chopped strand mat, a composite material, and a communication signal transport medium.

The present invention includes a process for providing continuous, manufacturable low dielectric glass fibers. The process may include the steps of providing a glass composition, such as disclosed herein, to a melting zone of a glass melter; heating the composition to a forming temperature in excess of the liquidus temperature; and continuously fiberizing the molten glass whereby a low dielectric constant and low dissipation factor glass fiber is produced.

BRIEF DESCRIPTION OF THE DRAWINGS

Some embodiments of the invention are herein described, by way of example only, with reference to the accompanying drawing. With specific reference now to the drawing in detail, it is stressed that the particulars shown are by way of example, are not necessarily to scale and are for purposes of illustrative discussion of embodiments of the invention. In this regard, the description taken with the drawing makes apparent to those skilled in the art how embodiments of the invention may be practiced. In the drawings:

FIG. 1 is a graph showing the relationship between liquidus temperature ($T_{liq}$) and dissipation factor (Df), in accordance with some embodiments of the invention.

DETAILED DESCRIPTION OF EMBODIMENTS OF THE INVENTION

The present invention is directed to glass compositions and fibers preferably having low dielectric constant values and low dissipation factors, also referred to herein as tan δ. The glass fibers of the present invention are preferably suitable for use in connection electronic devices and systems that operate at high processing speeds and/or high frequencies, such as mobile or stationary wireless telephones, computers, smartphones, tablets, and the like. The glass fibers of the present invention preferably yield a lower dielectric constant and dissipation factor than that of E-Glass but with better workability properties than D-Glass. While mainly described in terms of its use in connection with electronic devices and reinforcement of printed circuit boards, other uses and benefits of the glass compositions and glass fibers of the present invention may be contemplated without departing from the spirit and scope of the present invention. The present invention also discloses fiberglass reinforced articles, products incorporating glass fibers, such as printed circuit boards, woven fabrics, non-woven fabrics, unidirectional fabrics, chopped strands, chopped strand mats, composite material, and communication signal transport mediums, and a process for providing continuous and manufacturable low dielectric glass fibers.

The composition of the present invention is generally composed of one or more of the following oxides including silicon oxide ($SiO_2$), boron oxide ($B_2O_3$), aluminum oxide ($Al_2O_3$), calcium oxide (CaO), phosphorous oxide ($P_2O_5$), magnesium oxide (MgO), and titanium oxide ($TiO_2$). Additional oxides may be present as discussed below without departing from the spirit and scope of the present invention. The composition of the present invention, in some embodiments, has a liquidus temperature greater than 1100° C. and a glass viscosity of 1000 poise at a temperature (T log 3) greater than 1350° C. Further, the glass fibers of the present invention preferably have a dielectric constant less than or equal to 6, and/or a dissipation factor less than or equal to $38 \times 10^{-4}$ at a frequency of 10 GHz at room temperature. Beneficially, the composition of the present glass preferably has the ability to fiberize continuously because of its positive difference ($\Delta T_3$) between the T log 3 viscosity temperature and liquidus temperature.

Unless otherwise stated, the following terms used in the specification and claims have the meanings given below.

As used herein, the term "liquidus" is given its ordinary and customary meaning, generally inclusive of the temperature, ($T_{liq}$) at which equilibrium exists between liquid glass and its primary crystalline phase, whereas at all temperatures above the liquidus, the glass melt is free from crystals in its primary phase and at temperatures below the liquidus, crystals may form in the melt. The liquidus temperature therefore provides a useful lower temperature limit above which it is possible to continuously fiberize the glass.

The term "fiberizing temperature" or "T log 3 viscosity temperature" is understood to mean the temperature at which the glass has a viscosity equal to 1000 poise (denoted by T log 3).

As used herein, the term "delta-T," also referred to as "$\Delta T_3$", is given its ordinary and customary meaning in the art, generally inclusive of the difference between the fiberizing temperature and the liquidus, and thus, is a fiberizing property of the glass composition. The larger the delta-T, the more process flexibility exists during the formation of glass fibers and the less likely devitrification (crystallization) of the glass melt will occur during melting and fiberizing. Typically, the greater the delta-T, the lower the production cost of the glass fibers, in part by extending bushing life and by providing a wider fiber-forming process window.

The term "fiber" refers to an elongated body, the length dimension of which is greater than the transverse dimensions of width and thickness. Accordingly, the term fiber includes monofilament, multifilament, ribbon, strip, staple and other forms of chopped, cut or discontinuous fiber and the like having regular or irregular cross-sections. Fiber and filament are used interchangeably herein.

The term "E-Glass" is used according to its meaning as described in ASTM D-578.

The term "D-Glass" refers to a glass composition having the properties as set forth herein.

By "low dielectric constant" is meant a glass fiber having a dielectric constant lower than E-Glass. By way of example, E-Glass, has a dielectric constant of about 6.1 at a frequency of 10 GHz at room temperature.

By "low dissipation factor" is meant a glass fiber having a dissipation factor lower than E-Glass. By way of example, E-Glass has a dissipation factor of about $38 \times 10^{-4}$ at a frequency of about 10 GHz at room temperature.

By "low dielectric glass fiber" is meant a glass fiber with a low dielectric constant and low dissipation factor as defined herein.

Generally, glasses that are melted at sufficiently high temperature for sufficiently long times tend to be chemically and structurally homogeneous, that is lacking in regions of different chemical makeup or atomic arrangement. Moreover, the minimum amount of homogeneity necessary for continuous fiberization is that state of the melt where an inhomogeneity is too small to disturb the fiberization process and therefore fibers can be stably and continuously formed. Efficient fiberization requires a glass melt quality that is consistent with regard to a liquid's viscosity. Perturbations in viscosity disrupt flow and causes fiber breakage during forming. Glass melt defects either from unmelted batch materials (stones), poorly melted or homogenized glass (striae/cords) and devitrification products (crystals formed at temperatures below $T_{liq}$) are typical culprits. During their course of study, the inventors have found that the glasses within the instant glass family are susceptible to liquid-liquid immiscibility (glass phase separation) on cooling from high temperature. Phase separation is the tendency for a homogeneous liquid at high temperature to thermodynamically demix into two different glasses on cooling, often with very different compositions, liquid structures and associated properties. Moreover, phase separated glasses can exhibit discontinuous rather than continuous viscosity behavior as a function of temperature and thus phase separated regions of the melt can impede stable fiber forming.

In an attempt to understand and control this phase separation tendency, the inventors utilized the following method to characterize the glass melt stabilities of each composition after melting and during cooling. At the conclusion of each melt-cycle, the crucible was removed from the furnace and allowed to cool naturally to below the glass transformation temperature, $T_g$. Glasses that were less than stable exhibited various degrees of opalescence (light scattering) in the cooled state. Each melt was graded on a scale of 1-6 (a "melt instability index") from no opalescence (1, very stable) to 6 (least stable, opaque). These grades were sufficient to help delineate regions of good glass forming stability from regions of poor or unstable glass forming behavior. Glasses with high melt instability index values (greater than 4) would be expected to be difficult to fiberize in a continuous/steady manufacturing process. Reference to these melt instability index values will be made throughout this specification, including with respect to the Tables of laboratory results included below.

Glass compositions for the formation of glass fibers that are preferably suitable for use in electronic applications and articles and that are preferably capable of being economically formed through continuous fiberization into glass fibers are provided.

In some embodiments of the invention, the glass fiber includes a composition having between 45 and 58 weight percent silicon dioxide ($SiO_2$) (also referred to herein as silica). Alternatively, the silicon dioxide content may be between 45.5 and 57.5 weight percent. Further alternatively, the silicon dioxide content may be between 46 and 57 weight percent. In yet a further embodiment, the silicon dioxide content may be less than 56.75 weight percent. In yet an even further embodiment, the silicon dioxide content may be less than 56.50 weight percent. When the silicon dioxide percentage is outside of this range, the viscosity and fiberization of the glass is typically affected. For example, the viscosity of the glass may decrease to the extent that devitrification (crystallization) during fiberization results when silicon dioxide is less than 45 weight percent of the total composition of the glass fiber. In contrast, when silicon dioxide is greater than 58 weight percent of the total composition of the glass fiber, the glass may become too viscous thereby making it more difficult to melt, homogenize, and refine. Thus, the silica content is preferably between 45 and 58 weight percent of the total composition of the glass. Further, when combined with the other constituents as set forth herein, a silica content between 45.00 and 58.00 weight percent typically yields a glass fiber having a desirable low dielectric constant as well as a low dissipation factor. In one embodiment of the glass fiber and/or glass composition of the present invention, the silica content is at least 45.50 weight percent. Alternatively, the silica content is at least 46.00 weight percent. In another embodiment of the glass fiber and/or glass composition of the present invention, the silica content is no more than 57.50 weight percent. Alternatively, the silica content is no more than 57.00 weight percent. Yet further alternatively, the silica content is no more than 56.75 weight percent. In another embodiment, the silica content is no more than 56.50 weight percent.

Notwithstanding the above, the inventors have identified certain surprisingly useful and/or effective formulations wherein the glass fiber includes a composition having between 48 and 57 weight percent silicon dioxide ($SiO_2$). Alternatively, the silicon dioxide content may be between 49 and 56.5 weight percent. Further alternatively, the silicon dioxide content may be between 50 and 56 weight percent. In yet a further embodiment, the silicon dioxide content may be less than 56.0 weight percent. When the silicon dioxide percentage is outside of these ranges, the viscosity and fiberization of the glass is typically affected. For example, the viscosity of the glass may decrease to the extent that devitrification (crystallization) during fiberization results when silicon dioxide is less than 48 weight percent of the total composition of the glass fiber. In contrast, when silicon dioxide is greater than 57 weight percent of the total composition of the glass fiber, the glass may become too viscous thereby making it more difficult to melt, homogenize, and refine. Thus, the silica content is preferably between 48 and 57 weight percent of the total composition of the glass. It should also be understood that $SiO_2$ is useful for controlling stability of the formulation and that the weight percent of $SiO_2$ is also optionally selected for such considerations in combination with the other factors described herein.

The glass fiber in some embodiments of the invention includes a composition having greater than 18 weight percent boron oxide ($B_2O_3$) and no more than 26 weight percent boron oxide. Alternatively, the boron oxide content may be between 18.5 and 25 weight percent. Further alternatively, the boron oxide content may be between 19 and 22 weight percent. A high percentage of boron oxide, such as above 26 weight percent, may cause an excessive loss of $B_2O_3$ during melting, poor homogeneity, low strength, and poor mechanical properties. When combined with the other constituents as set forth herein, a boron oxide content greater than 18.00 weight percent and no more than 26.00 weight percent typically yields a glass fiber having a desirable low dielectric constant as well as a low dissipation factor. In one embodiment of the glass fiber and/or glass composition of the present invention, the boron oxide content is at least 18.50 weight percent. Alternatively, the boron oxide content is at least 19.00 weight percent. In another embodiment of the glass fiber and/or glass composition of the present invention, the boron oxide content is no more than 25.00 weight percent. Alternatively, the boron oxide content is no more than 24.00 weight percent.

Notwithstanding the above, the inventors have identified certain surprisingly useful and/or effective formulations wherein the glass fiber includes a composition having between 15 weight percent boron oxide ($B_2O_3$) and 26 weight percent boron oxide. It is generally understood that $B_2O_3$ is favorable for lowering Df, but too much can create glass instability in the form of phase separation. Alternatively, the boron oxide content may be between 15.5 and 25.5 weight percent. Further alternatively, the boron oxide content may be between 16 and 25 weight percent. A high percentage of boron oxide, such as above 26 weight percent, may cause an excessive loss of $B_2O_3$ during melting, poor homogeneity, poor mechanical properties, and glass instability in the form of phase separation. Further, a low percentage of boron oxide, such as below 15 weight percent, may cause insufficient dielectric properties. Thus, the boron oxide content is preferably between 15 weight percent and 26 weight percent of the total composition of the glass. Further, when combined with the other constituents as set forth herein, a boron oxide content between 15.00 and 26.00 weight percent typically yields a glass fiber having a desirable low dielectric constant as well as a low dissipation factor. In one embodiment of the glass fiber and/or glass composition of the present invention, the boron oxide content is at least 16.0 weight percent. Additionally, alternatively and/or optionally, the boron oxide content is no more than 20.00 weight percent. In another embodiment of the glass fiber and/or glass composition of the present invention, the boron oxide content is no more than 25.00 weight percent.

The glass fiber in some embodiments of the present invention includes a composition having greater than 16 weight percent and no more than 23 weight percent aluminum oxide. Alternatively, the aluminum oxide content may be greater than 16 weight percent and no more than 22.5 weight percent. Further alternatively, the aluminum oxide content may be greater than 16 weight percent and no more than 22 weight percent. The percentage of aluminum oxide with respect to the total composition of the glass fiber may also affect the viscosity and fiberization process. For example, a high percentage of aluminum oxide, such as above 23 weight percent, may cause the melt viscosity to decrease so that devitrification during fiberization results. A low percentage of aluminum oxide, such as at or below 18 weight percent, may cause phase separation and poor fiber formation. Thus, the alumina content is preferably greater than 16 weight percent and no more than 23 weight percent of the total composition of the glass. Further, when combined with the other constituents as set forth herein, an alumina content between 16.00 and 23.00 weight percent typically yields a glass fiber having a desirable low dielectric constant as well as a low dissipation factor. In one embodiment of the glass fiber and/or glass composition of the present invention, the alumina content is no more than 22.50 weight percent. Alternatively, the alumina content is no more than 22.00 weight percent.

Aluminum oxide is known to stabilize glasses that are prone to phase separation/melt instability. However, it is also known to increase the tendency toward devitrification/crystallization at high levels, and therefore it can be bad for fiber forming stability with respect to delta-T. In view of these tendencies of $Al_2O_3$, for example being the opposite of $B_2O_3$ in some respects, and other components of the described formulations, it is important to find the correct balance amongst all of them. In view of the above and notwithstanding the ranges previously disclosed herein, the inventors have identified certain surprisingly useful and/or effective formulations wherein, in some embodiments of the invention, a balance of Df behavior and $T_{liq}$ behavior is achieved when $Al_2O_3$ is present in the range of 12 to 18 weight percent. In some embodiments of the invention, $Al_2O_3$ is present in the range of 12.5 to 17.5 weight percent. $Al_2O_3$ is present in the range of 13 to 17 weight percent, in some embodiments of the invention. It should be understood that these ranges are given to assist the reader with envisioning working formulations for the inventors' compositions, however, it should also be understood that formulations using any weight percent including within any of the ranges of $Al_2O_3$ described herein, could be used to achieve acceptable formulations for the stated purposes of the invention.

The glass fiber of the present invention typically also includes a composition having between 3 and 8 weight percent phosphorus oxide ($P_2O_5$, also referred to as phosphorous pentoxide). Alternatively, the phosphorous oxide content may be between 3 and 7.5 weight percent. Further alternatively, the phosphorous oxide content may be between 3 and 7 weight percent. The inventors surprisingly found that this range is optimal for balancing the Df behavior with the $T_{liq}$ and melt instability index. More specifically, $P_2O_5$ was found to synergistically associate with the $Al_2O_3$ content of the glass, thereby decreasing the melt stability (increasing the instability index value) while simultaneously also improving the key metrics of Df and the $T_{liq}$. Inventors speculate that the phosphorous preferentially associates with some of the $Al_2O_3$ forming $AlPO_4$ network linkages rendering a portion of the $Al_2O_3$ unable to devitrify into Alumino-Borate Mullite. It should also be noted that the inventors have identified this greater than 3% to 7% weight percent range of $P_2O_5$ even though it may have a negative impact on viscosity in view of what is known to those of ordinary skill in the art.

Alkaline earth oxides (magnesium oxide (MgO), calcium oxide (CaO), and sometimes strontium oxide (SrO)) all help these glasses to melt and homogenize at reasonable temperatures achievable by melting furnaces known in the art. However, these oxides directly affect and harm the low dielectric behavior desired by the industry (MgO increases the Df less than CaO, and SrO increases the Df more than CaO). CaO is typically the preferred alkaline earth addition because compared to the alternatives it provides the best compromise between viscosity, $T_{liq}$ and Df. However, too little alkaline earth oxide drives the glass melt toward instability (higher index numbers). For at least this reason, the glass fiber composition of the present invention may also include CaO (also referred to herein as calcia) and/or MgO, as described below.

The glass fiber of the present invention includes, in some embodiments of the invention, a composition having between 0.25 weight percent calcium oxide and 7.0 weight percent calcium oxide. Alternatively, the calcium oxide content may be between 0.25 weight percent and 6.5 weight percent. Further alternatively, the calcium oxide content may be between 0.25 weight percent and 6 weight percent. Yet further alternatively, the calcium oxide content may be between 2.5 weight percent and 5.0 weight percent. The weight percent of calcium oxide may impact the viscosity and devitrification process of the glass fiber. A high percentage of calcium oxide, such as above 7.0 weight percent may cause insufficient dielectric properties. Further, a low percentage of calcium oxide, such as at or below 0.25 weight percent, may cause poor fiber formation. For example, below 0.25 weight percent calcia, the viscosity is too high and the resulting glass homogeneity is insufficient for acceptable continuous fiber formation. When combined with the other constituents as set forth herein, in some embodiments a calcium oxide content between 1.25 weight percent and 5.85 weight percent typically yields a glass fiber having a desirable low dielectric constant as well as a low dissipation factor. In one embodiment of the glass fiber and/or glass composition of the present invention, the calcia content is 4.5 or less weight percent. Alternatively, the calcia content is 4.25 or less weight percent. Further alternatively, the calcia content is 4.00 or less weight percent.

The glass fiber composition of the present invention may also include MgO (also referred to herein as magnesia). The glass fiber of the present invention may include a composition having less than or equal to 5.0 weight percent magnesium oxide. Alternatively, the magnesium oxide content may be less than or equal to 4.5 weight percent. Further alternatively, the magnesium oxide content may be less than or equal to 4.0 weight percent. In yet a further alternative embodiment, the magnesium oxide content may be less than or equal to 2.0 weight percent. In yet a further alternative embodiment, the magnesium oxide content may be less than or equal to 1.5 weight percent. Like calcium oxide, the weight percent of magnesium oxide also may harm the viscosity and devitrification process of the glass fiber. Further, a high percentage of magnesium oxide, such as above 5.0 weight percent may cause insufficient dielectric properties.

Titanium oxide ($TiO_2$) is optionally present, or intentionally introduced, in the glass composition and fibers of the present invention. In one embodiment, the weight percent of titanium oxide is no more than 6.0. Alternatively, the weight percent of titanium oxide is no more than 5.5. Further alternatively, the weight percent of titanium oxide is no more than 5.0. Having 6 weight percent or more titanium oxide seems to lead to an increased tendency towards phase separation in the glass composition and fibers, especially when combined with phosphorous pentoxide.

Titanium oxide typically acts as a viscosity reducer and may be intentionally added or present as an impurity from conventional raw materials. Thus, titanium oxide may be present in the glass composition at a weight percent at or greater than 0.01. Alternatively, titanium oxide may be present in the glass composition at a weight percent at or greater than 0.05. Further alternatively, titanium oxide may be present in the glass composition at a weight percent at or greater than 0.1.

Since a stated objective of the present invention is to manufacture the most stable glasses reasonably possible for the melting and fiberizing process, it would also not have been expected by one of ordinary skill in the art that within this family that $TiO_2$ up to and including 6 weight percent could be tolerated without harming the $T_{liq}$ and creating delta-T behavior that would render these glasses unfiberizable (delta-T<40° C.). See page 37, Wolfram Holand, et al., *Glass Ceramic Technology*, 2nd Edition, Wiley and Sons, July 2012.

$TiO_2$ is known in the art as an acceptable additive to other low $D_k$ glasses in order to lower their viscosity. With this in view, it was counter-intuitive that the inventors were able to achieve acceptable delta-T ranges (T log 3-$T_{liq}$) within parent glass compositions by incorporating any amount of nucleating agent ($TiO_2$, which would be expected to increase the rate of crystallization, and possibly $T_{liq}$) but is also is known to decrease viscosity (T log 3).

Interestingly none of the relevant prior art presents any examples of $P_2O_5$ and meaningful amounts of $TiO_2$ combined together, making it difficult to predict any synergistic or desirable behavior.

Additional oxides may be present in the glass fibers and compositions of the present invention without departing from the scope thereof. For example, oxides, such as lithium oxide ($Li_2O$), sodium oxide ($Na_2O$), potassium oxide ($K_2O$), barium oxide (BaO), strontium oxide (SrO), zinc oxide (ZnO), fluorine (F or $F_2$), tin oxide ($SnO_2$), zirconium oxide ($ZrO_2$), chromium oxide ($Cr_2O_3$), iron oxide ($Fe_2O_3$), lanthanum oxide ($La_2O_3$), manganese oxide ($Mn_2O_3$), yttrium oxide ($Y_2O_3$), and/or vanadium oxide ($V_2O_3$) may be present. Moreover, the combined total of these additional oxides is no more than 3 weight percent of the total composition, so long as they do not alter the function of the glass. Alternatively, the combined total of these additional oxides may be no more than 2 weight percent of the total composition. Further alternatively, the combined total of these additional oxides may be no more than 1.5 weight percent of the total composition. Yet further alternatively, the combined total of these additional oxides may be no more than 3.0, 2.0 and/or 1.0 weight percent of the total composition, in some embodiments of the invention.

Because of the profound impacts even minor amounts of alkali metal oxides can have on a glass composition, the combined total of alkali metal oxides, such as $Na_2O$, $K_2O$, and $Li_2O$, is preferably no more than 1.0 total weight percent of the composition. More preferably, the combined total is no more than 0.5 total weight percent of the composition. Even more preferably, the combined total is no more than 0.25 total weight percent of the composition.

Example glass compositions and glass fibers of the present invention are set forth herein. In one embodiment, the glass composition and/or glass fiber includes between 48.0 to 57.0 weight percent $SiO_2$; between 15.0 and 26.0 weight percent $B_2O_3$; between 12.0 and 18.0 weight percent $Al_2O_3$; between 3.0 and 8.0 weight percent $P_2O_5$; between 0.25 and 7.0 weight percent CaO; 5.0 or less weight percent MgO; and 6.0 or less weight percent $TiO_2$. An alternative glass composition and/or glass fiber of the present invention may include between 49 to 56.5 weight percent $SiO_2$; between 15.5 to 25.5 weight percent $B_2O_3$; between 12.5 and 17.5 weight percent $Al_2O_3$; between 3.0 and 7.5 weight percent $P_2O_5$; between 0.25 and 6.5 weight percent CaO; 4.50 or less weight percent MgO; and 5.5 or less weight percent $TiO_2$. In yet a further alternative glass composition and/or glass fiber of the present invention, the following constituents may be included: between 50 to 56.0 weight percent $SiO_2$; between 16.0 to 25.0 weight percent $B_2O_3$; between 13.0 and 17.0 weight percent $Al_2O_3$; between 3.0 and 7.0 weight percent $P_2O_5$; between 0.25 and 6.0 weight percent CaO; 4.0 or less weight percent MgO; and 5.0 or less weight percent $TiO_2$.

The glass composition of the present invention has a liquidus temperature greater than 1100° C. In an alternative embodiment, the glass composition may have a liquidus temperature greater than 1150° C. In yet a further alternative embodiment, the glass composition may have a liquidus temperature greater than 1200° C. Having a liquidus temperature greater than 1100° C., or more preferably greater than 1150° C., is favorable for fiberizing a glass composition according to the present invention.

Further, the glass composition of the present invention may have a T log 3 viscosity temperature greater than 1350° C. Alternatively, the glass composition may have a T log 3 viscosity temperature greater than 1355° C. In yet a further alternative embodiment, the glass composition may have a T log 3 viscosity temperature greater than 1360° C. Having a T log 3 viscosity temperature greater than 1350° C. is favorable for fiberizing a glass composition according to the present invention.

The glass fibers of the present invention may have a dielectric constant less than or equal to 6. Alternatively, the glass fibers may have a dielectric constant less than or equal to 4.60. In a further alternative embodiment, the glass fibers may have a dielectric constant less than or equal to 4.55.

Further, the glass fibers of the present invention may have a dissipation factor less than or equal to $38 \times 10^{-4}$ at a frequency of 10 GHz at room temperature. Alternatively, the glass fibers may have a dissipation factor less than or equal to $30 \times 10^{-4}$ at a frequency of 10 GHz at room temperature. In a further alternative embodiment, the glass fibers of the present invention may have a dissipation factor less than or equal to $25 \times 10^{-4}$ at a frequency of 10 GHz at room temperature.

The glass fibers of the present invention may be incorporated into a fiberglass-reinforced article, such as a printed circuit board. Further, the glass fibers of the present invention may be used in connection with products such as woven fabrics, non-woven fabrics, unidirectional fabrics, chopped strands, chopped strand mats, composite materials, and communication signal transport mediums.

The present invention also includes a process for providing continuous, manufacturable low dielectric glass fibers. The process may include the steps of providing a glass composition, such as disclosed herein, to a melting zone of a glass melter; heating the composition to a forming temperature in excess of the liquidus temperature; and continuously fiberizing the molten glass whereby a low dielectric constant and low dissipation factor glass fiber is produced.

As discussed above, the composition of the glass for providing low dielectric constant glass fibers is, at least in part, based on the weight percent of the oxides discussed above as well as the ratios and combined weights of silicon dioxide, aluminum oxide, boron oxide, calcium oxide, magnesium oxide, phosphorus oxide, and/or titanium oxide. In one aspect, the combination of these parameters, in addition to other parameters discussed herein, such as T log 3 viscosity temperature, makes it possible to obtain glass fibers having a low dielectric constant and low dissipation factor as set forth herein.

In comparison to previous efforts in this field, Creux's formulations illustrate glasses with wholly inferior Df behavior (Df~0.0090 at 10 GHz), as shown in the two (2) examples of US2004/01755557. In contrast, the current invention achieves Df<0.0028. Furthermore, Creux's T log 3 is <1350° C. and $T_{liq}$ is <1000° C. Zhang, on the other hand, does not describe Df behavior of its glasses at all. T log 3 of Zhang's glasses are <1350° C. and $T_{liq}$ are all<1000° C. Interestingly, Zhang describes that their glasses have excellent devitrification behavior because the primary crystal phases (Wollastonite/Diopside/Calcium Feldspar) all compete with one another. See para. [0014] of CN103351102.

It is clear that one would not have been lead to combine most, if not all, of the prior art noted above to achieve the presently described glass invention, since the glass families in the state of the art have $T_{liq}$ below 1000° C. as well as T log 3 viscosity temperatures less than 1350° C.

It is well known in the art that chemical composition is the main determination of the primary crystal phase that will devitrify from a glass melt. See page 4, of Holand.

It is well known in the art that $TiO_2$ is used by glassmakers as a nucleating agent to help facilitate crystallization and devitrify glasses. See page 37, Holand. However, none of the prior art, including U.S. Pat. No. 5,958,808 to Mori, U.S. Pat. No. 6,309,990 to Tamura, U.S. Pat. No. 6,846,761 to Tamura, and US2011/0281484 to Yoshida, evidences or demonstrates the effective use of $TiO_2$ with a substantial and/or significant amount of $P_2O_5$, which the inventors believe creates a synergistic effect when they are combined in the amounts described herein.

Furthermore, the inventors unexpectedly discovered that the measured dielectric loss of the invention appears to be intimately related to the crystallization behavior of the instant glasses. That is that glasses with higher $T_{liq}$ values tend to have better, that is lower, Df characteristics. FIG. 1, shows this data relationship derived from the glasses of the present invention.

It is clear that for the glasses defined by the formulations disclosed by the inventors herein, in order to achieve the desired Df behavior (Df<0.0028, or <0.0027, or <0.0026, or even lower), the glasses will tend to devitrify more easily, that is at higher $T_{liq}$ values for instance values>1100° C. Moreover, the most desirable Dfs are at a $T_{liq}$ significantly greater than 1100° C.

The inventors have further surprisingly discovered that the most desirable glass for obtaining low Df behavior is one which has an inherent network structure that is predisposed to crystalize into and form Alumino-Borate Mullite (needle) crystals.

Zhang on the other hand clearly states that its glasses produce Wollastonite, Diopside and Ca-Feldspar crystals and not Alumino-Borate Mullite.

The inventors speculate that glasses that tend to fall within this Alumino-Borate Mullite primary phase field have an inherently suitable network structure for both good glass forming and excellent (i.e. low) Df behavior.

Similarly to Creux, the glasses invented by Kuhn (WO2010/011701) also have inferior Df behavior (Df≥0.0044) and only Ex. #1 of the 6 examples shows a positive delta-T for acceptable fiber forming (refer to Kuhn, Table II).

Having generally described the inventors' unexpectedly effective formulations along with their discoveries herein, a further understanding can be obtained by reference to certain specific examples illustrated below which are provided for purposes of illustration only and are not intended to be all inclusive or limiting unless otherwise specified.

EXAMPLES

Example glass compositions made according to the present invention are set forth below. The particular components and amounts thereof recited in these examples, as well as other conditions and details, should not be construed to unduly limit this invention. In these examples and throughout this description, all percentages, proportions and ratios are by weight (mass) unless otherwise indicated.

Exemplary glass compositions of the present invention are shown in Tables 1-12 below. The liquidus temperature of the example glass compositions is represented as "$T_{liq}$" and the temperature where the glass composition had a viscosity of 1000 poise is represented as "$T_3$" (also referred to as "T log 3" viscosity temperature). The liquidus temperature and $T_3$ temperature of the example glass compositions were measured for some of the glass compositions and calculated for others. Glass fibers were formed using the example compositions and the dielectric constant and dissipation factor was measured for some of the glass fibers and calculated for others. The dielectric constant is represented as the "$D_k$" value and the dissipation factor is represented as the "Df" value.

TABLE 1

| Example # | $SiO_2$ | $B_2O_3$ | $Al_2O_3$ | $P_2O_5$ | CaO | MgO | SrO | $TiO_2$ | $Fe_2O_3$ | $Na_2O$ | $K_2O$ | $SnO_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 1 | 50.73 | 24.57 | 17.07 | 3.96 | 3.30 | 0.04 | 0.00 | 0.01 | 0.03 | 0.04 | 0.01 | 0.22 | 2 | 0.0019 | 4.32 | 1377 | 1342 |
| 2 | 51.12 | 24.85 | 16.97 | 3.42 | 3.28 | 0.04 | 0.00 | 0.01 | 0.03 | 0.03 | 0.01 | 0.23 | 2 | 0.0019 | 4.33 | 1374 | 1374 |
| 3 | 51.82 | 24.70 | 15.94 | 3.92 | 3.26 | 0.04 | 0.00 | 0.01 | 0.03 | 0.04 | 0.01 | 0.22 | 4 | 0.0018 | 4.32 | 1393 | 1320 |
| 4 | 51.33 | 24.60 | 16.49 | 3.92 | 3.29 | 0.04 | 0.00 | 0.01 | 0.03 | 0.04 | 0.01 | 0.23 | 3 | 0.0018 | 4.32 | 1386 | 1327 |
| 5 | 51.89 | 24.11 | 16.45 | 3.92 | 3.27 | 0.04 | 0.00 | 0.01 | 0.03 | 0.04 | 0.01 | 0.23 | 3 | 0.0019 | 4.33 | 1393 | 1331 |
| 6 | 52.37 | 24.54 | 16.00 | 3.44 | 3.28 | 0.04 | 0.00 | 0.01 | 0.03 | 0.04 | 0.01 | 0.23 | 3 | 0.0018 | 4.34 | 1393 | 1331 |
| 7 | 51.80 | 24.69 | 16.42 | 3.44 | 3.28 | 0.04 | 0.00 | 0.01 | 0.03 | 0.06 | 0.01 | 0.22 | 3 | 0.0018 | 4.33 | 1385 | 1339 |
| 8 | 52.25 | 24.18 | 16.47 | 3.44 | 3.28 | 0.04 | 0.00 | 0.01 | 0.03 | 0.05 | 0.01 | 0.23 | 3 | 0.0019 | 4.34 | 1391 | 1345 |
| 9 | 52.69 | 23.80 | 16.43 | 3.43 | 3.28 | 0.04 | 0.00 | 0.01 | 0.03 | 0.05 | 0.01 | 0.22 | 3 | 0.0019 | 4.35 | 1396 | 1345 |
| 10 | 51.44 | 23.80 | 16.31 | 4.28 | 3.78 | 0.05 | 0.00 | 0.01 | 0.03 | 0.04 | 0.01 | 0.23 | 3 | 0.0020 | 4.35 | 1392 | 1299 |

TABLE 2

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 11 | 50.77 | 24.24 | 16.78 | 3.99 | 3.83 | 0.04 | 0.00 | 0.01 | 0.04 | 0.05 | 0.01 | 0.23 | 2 | 0.0020 | 4.35 | 1379 | 1325 |
| 12 | 51.32 | 23.52 | 16.80 | 3.98 | 3.97 | 0.04 | 0.00 | 0.01 | 0.04 | 0.07 | 0.02 | 0.24 | 2 | 0.0021 | 4.37 | 1386 | 1318 |
| 13 | 48.89 | 23.79 | 16.26 | 6.94 | 3.75 | 0.04 | 0.00 | 0.01 | 0.03 | 0.04 | 0.01 | 0.23 | 4 | 0.0019 | 4.28 | 1399 | |
| 14 | 53.32 | 22.02 | 16.44 | 3.50 | 4.34 | 0.05 | 0.00 | 0.01 | 0.04 | 0.05 | 0.01 | 0.22 | 1 | 0.0022 | 4.43 | 1404 | 1293 |
| 15 | 53.51 | 22.33 | 16.42 | 3.02 | 4.35 | 0.05 | 0.00 | 0.01 | 0.03 | 0.06 | 0.01 | 0.23 | 1 | 0.0022 | 4.44 | 1399 | 1302 |
| 16 | 50.72 | 23.66 | 16.27 | 5.15 | 3.84 | 0.04 | 0.00 | 0.01 | 0.03 | 0.04 | 0.01 | 0.23 | 3 | 0.0020 | 4.33 | 1396 | 1278 |
| 17 | 51.30 | 23.07 | 16.27 | 4.75 | 4.25 | 0.05 | 0.00 | 0.01 | 0.03 | 0.03 | 0.01 | 0.22 | 2 | 0.0021 | 4.37 | 1397 | 1264 |
| 18 | 51.06 | 22.80 | 16.32 | 5.15 | 4.30 | 0.04 | 0.00 | 0.01 | 0.03 | 0.04 | 0.01 | 0.23 | 2 | 0.0021 | 4.37 | 1400 | 1263 |
| 19 | 52.01 | 23.45 | 16.41 | 3.99 | 3.81 | 0.04 | 0.00 | 0.01 | 0.02 | 0.01 | 0.01 | 0.23 | 2 | 0.0020 | 4.37 | 1398 | 1314 |
| 20 | 51.81 | 23.79 | 16.27 | 3.95 | 3.80 | 0.05 | 0.00 | 0.01 | 0.04 | 0.05 | 0.01 | 0.23 | 2 | 0.0020 | 4.36 | 1393 | 1311 |

TABLE 3

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 21 | 51.38 | 24.31 | 16.26 | 3.94 | 3.77 | 0.04 | 0.00 | 0.01 | 0.04 | 0.01 | 0.01 | 0.02 | 3 | 0.0020 | 4.34 | 1387 | 1311 |
| 22 | 51.16 | 24.69 | 16.16 | 3.91 | 3.75 | 0.04 | 0.00 | 0.01 | 0.03 | 0.01 | 0.01 | 0.23 | 3 | 0.0019 | 4.33 | 1383 | 1305 |
| 23 | 51.61 | 24.01 | 16.31 | 3.96 | 3.74 | 0.06 | 0.00 | 0.01 | 0.03 | 0.03 | 0.01 | 0.22 | 3 | 0.0020 | 4.36 | 1390 | 1299 |
| 24 | 51.58 | 23.53 | 15.99 | 4.00 | 3.73 | 0.08 | 0.01 | 0.34 | 0.38 | 0.11 | 0.03 | 0.22 | 3 | 0.0022 | 4.41 | 1394 | 1289 |
| 25 | 51.89 | 23.93 | 16.35 | 3.97 | 2.89 | 0.67 | 0.00 | 0.01 | 0.04 | 0.01 | 0.01 | 0.22 | 3 | 0.0019 | 4.33 | 1391 | 1303 |
| 26 | 52.17 | 23.80 | 16.40 | 4.01 | 1.97 | 1.33 | 0.00 | 0.01 | 0.03 | 0.04 | 0.01 | 0.23 | 4 | 0.0019 | 4.31 | 1394 | 1318 |
| 27 | 52.08 | 24.22 | 15.39 | 3.98 | 1.03 | 1.98 | 0.00 | 0.01 | 0.03 | 0.04 | 0.01 | 0.22 | 5 | 0.0018 | 4.26 | 1390 | 1329 |
| 28 | 52.37 | 24.03 | 16.46 | 4.02 | 0.10 | 2.70 | 0.00 | 0.01 | 0.03 | 0.04 | 0.01 | 0.22 | 6 | 0.0019 | 4.22 | 1392 | 1344 |
| 29 | 51.52 | 24.13 | 15.72 | 3.91 | 3.81 | 0.04 | 0.00 | 0.57 | 0.03 | 0.02 | 0.01 | 0.23 | 3 | 0.0019 | 4.35 | 1388 | 1284 |
| 30 | 51.95 | 23.82 | 15.02 | 3.98 | 3.83 | 0.04 | 0.00 | 1.07 | 0.03 | 0.03 | 0.01 | 0.22 | 3 | 0.0019 | 4.34 | 1395 | 1265 |

TABLE 4

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 31 | 51.79 | 24.25 | 14.29 | 3.94 | 3.79 | 0.04 | 0.00 | 1.61 | 0.03 | 0.02 | 0.01 | 0.23 | 4 | 0.0019 | 4.36 | 1393 | 1238 |
| 32 | 52.01 | 24.10 | 15.01 | 3.97 | 4.55 | 0.04 | 0.00 | 0.02 | 0.03 | 0.02 | 0.01 | 0.22 | 3 | 0.0021 | 4.33 | 1398 | 1210 |
| 33 | 52.29 | 24.30 | 13.62 | 4.01 | 5.43 | 0.05 | 0.00 | 0.02 | 0.03 | 0.02 | 0.01 | 0.22 | 3 | 0.0022 | 4.36 | 1405 | |
| 34 | 51.29 | 22.47 | 16.45 | 5.14 | 4.28 | 0.05 | 0.02 | 0.01 | 0.03 | 0.03 | 0.01 | 0.23 | 2 | 0.0021 | 4.37 | 1402 | 1250 |
| 35 | 52.82 | 21.89 | 16.27 | 5.15 | 0.13 | 3.44 | 0.00 | 0.01 | 0.03 | 0.03 | 0.01 | 0.22 | 6 | 0.0021 | 4.26 | 1411 | 1271 |
| 36 | 52.38 | 22.43 | 16.21 | 5.13 | 0.12 | 3.44 | 0.00 | 0.01 | 0.03 | 0.03 | 0.01 | 0.22 | 6 | 0.0022 | 4.31 | 1405 | 1270 |
| 37 | 52.42 | 22.56 | 16.09 | 5.15 | 0.12 | 3.37 | 0.00 | 0.01 | 0.03 | 0.02 | 0.01 | 0.22 | 6 | 0.0020 | 4.25 | 1407 | 1268 |
| 38 | 51.97 | 23.04 | 16.06 | 5.10 | 0.11 | 3.42 | 0.00 | 0.01 | 0.03 | 0.02 | 0.01 | 0.22 | 6 | 0.0020 | 4.24 | 1400 | 1266 |
| 39 | 51.99 | 22.17 | 16.27 | 5.25 | 2.34 | 1.63 | 0.04 | 0.01 | 0.03 | 0.06 | 0.01 | 0.22 | 4 | 0.0021 | 4.32 | 1408 | 1258 |
| 40 | 52.01 | 22.21 | 16.23 | 5.26 | 2.33 | 1.62 | 0.05 | 0.01 | 0.03 | 0.02 | 0.01 | 0.22 | 4 | 0.0021 | 4.38 | 1408 | 1257 |

TABLE 5

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 41 | 51.75 | 22.62 | 16.13 | 5.22 | 2.34 | 1.61 | 0.04 | 0.01 | 0.03 | 0.02 | 0.01 | 0.22 | 4 | 0.0021 | 4.31 | 1405 | 1255 |
| 42 | 51.34 | 23.11 | 16.07 | 5.18 | 2.34 | 1.61 | 0.04 | 0.01 | 0.03 | 0.02 | 0.01 | 0.23 | 4 | 0.0021 | 4.30 | 1400 | 1253 |
| 43 | 52.80 | 21.33 | 16.36 | 5.21 | 2.35 | 1.35 | 0.00 | 0.01 | 0.04 | 0.02 | 0.01 | 0.22 | 3 | 0.0022 | 4.35 | 1412 | 1262 |
| 44 | 51.84 | 21.91 | 16.29 | 5.24 | 2.35 | 1.66 | 0.00 | 0.44 | 0.03 | 0.01 | 0.01 | 0.22 | 4 | 0.0021 | 4.24 | 1404 | 1259 |

TABLE 5-continued

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 45 | 52.62 | 21.14 | 16.28 | 5.22 | 2.35 | 1.65 | 0.00 | 0.45 | 0.03 | 0.02 | 0.01 | 0.22 | 3 | 0.0022 | 4.33 | 1414 | 1259 |
| 46 | 51.74 | 21.74 | 16.98 | 5.24 | 2.34 | 1.66 | 0.00 | 0.01 | 0.04 | 0.02 | 0.01 | 0.23 | 3 | 0.0022 | 4.38 | 1402 | 1288 |
| 47 | 52.59 | 21.45 | 16.25 | 5.16 | 4.19 | 0.08 | 0.00 | 0.01 | 0.03 | 0.01 | 0.01 | 0.21 | 2 | 0.0022 | 4.41 | 1419 | 1255 |
| 48 | 51.93 | 22.05 | 16.36 | 5.21 | 3.37 | 0.79 | 0.00 | 0.01 | 0.03 | 0.01 | 0.01 | 0.22 | 3 | 0.0022 | 4.37 | 1409 | 1260 |
| 49 | 52.75 | 21.26 | 16.33 | 5.22 | 3.33 | 0.81 | 0.00 | 0.02 | 0.03 | 0.01 | 0.01 | 0.22 | 2 | 0.0022 | 4.34 | 1419 | 1259 |
| 50 | 54.52 | 19.70 | 16.56 | 5.32 | 0.14 | 3.49 | 0.00 | 0.01 | 0.03 | 0.02 | 0.01 | 0.22 | 5 | 0.0023 | 4.30 | 1433 | 1275 |

TABLE 6

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 51 | 54.02 | 19.91 | 16.49 | 5.25 | 1.22 | 2.57 | 0.00 | 0.25 | 0.03 | 0.02 | 0.01 | 0.22 | 4 | 0.0022 | 4.34 | 1429 | 1271 |
| 52 | 53.74 | 19.83 | 16.45 | 5.22 | 2.36 | 1.65 | 0.00 | 0.48 | 0.03 | 0.01 | 0.01 | 0.22 | 3 | 0.0022 | 4.36 | 1429 | 1284 |
| 53 | 53.65 | 19.67 | 16.32 | 5.22 | 3.44 | 0.70 | 0.00 | 0.71 | 0.04 | 0.02 | 0.01 | 0.22 | 2 | 0.0022 | 4.41 | 1429 | 1259 |
| 54 | 54.45 | 21.45 | 16.50 | 3.25 | 2.36 | 1.68 | 0.00 | 0.02 | 0.03 | 0.02 | 0.01 | 0.23 | 2 | 0.0022 | 4.38 | 1409 | 1316 |
| 55 | 55.45 | 20.35 | 16.56 | 3.24 | 2.38 | 1.70 | 0.00 | 0.02 | 0.03 | 0.02 | 0.01 | 0.24 | 2 | 0.0023 | 4.39 | 1418 | 1322 |
| 56 | 55.61 | 21.54 | 16.33 | 3.26 | 1.30 | 2.64 | 0.00 | 0.02 | 0.03 | 0.03 | 0.01 | 0.23 | 4 | 0.0022 | 4.35 | 1408 | 1300 |
| 57 | 55.54 | 20.70 | 16.30 | 3.27 | 1.24 | 2.66 | 0.00 | 0.01 | 0.03 | 0.03 | 0.01 | 0.22 | 3 | 0.0022 | 4.36 | 1420 | 1300 |
| 58 | 51.93 | 21.03 | 16.32 | 5.89 | 2.38 | 1.69 | 0.00 | 0.45 | 0.03 | 0.03 | 0.01 | 0.22 | 4 | 0.0022 | 4.37 | 1415 | 1242 |
| 59 | 55.03 | 20.54 | 16.34 | 3.21 | 2.41 | 1.73 | 0.00 | 0.45 | 0.03 | 0.02 | 0.01 | 0.23 | 2 | 0.0023 | 4.41 | 1416 | 1324 |
| 60 | 50.84 | 22.96 | 16.37 | 5.20 | 4.26 | 0.07 | 0.00 | 0.02 | 0.03 | 0.02 | 0.01 | 0.22 | 2 | 0.0022 | 4.38 | 1397 | 1257 |

TABLE 7

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 61 | 51.70 | 21.99 | 16.44 | 5.22 | 4.28 | 0.06 | 0.00 | 0.02 | 0.03 | 0.03 | 0.01 | 0.22 | 2 | 0.0022 | 4.38 | 1405 | 1258 |
| 62 | 52.45 | 21.45 | 16.33 | 5.15 | 4.22 | 0.08 | 0.00 | 0.02 | 0.03 | 0.04 | 0.01 | 0.22 | 2 | 0.0022 | 4.41 | 1417 | 1257 |
| 63 | 53.22 | 20.49 | 16.44 | 5.19 | 4.27 | 0.07 | 0.00 | 0.02 | 0.03 | 0.04 | 0.01 | 0.22 | 1 | 0.0022 | 4.41 | 1427 | 1258 |
| 64 | 53.27 | 21.23 | 16.35 | 4.24 | 3.20 | 0.98 | 0.00 | 0.45 | 0.03 | 0.02 | 0.01 | 0.22 | 2 | 0.0023 | 4.39 | 1410 | 1278 |
| 65 | 53.34 | 21.15 | 16.36 | 4.23 | 3.20 | 0.99 | 0.00 | 0.44 | 0.03 | 0.03 | 0.01 | 0.22 | 2 | 0.0023 | 4.39 | 1410 | 1278 |
| 66 | 54.19 | 20.36 | 16.32 | 4.22 | 3.20 | 0.98 | 0.00 | 0.44 | 0.03 | 0.03 | 0.01 | 0.22 | 2 | 0.0023 | 4.40 | 1421 | 1277 |
| 67 | 54.77 | 19.64 | 16.44 | 4.24 | 3.19 | 0.99 | 0.00 | 0.44 | 0.03 | 0.03 | 0.01 | 0.22 | 2 | 0.0013 | 4.41 | 1428 | 1281 |
| 68 | 51.92 | 21.88 | 16.38 | 5.22 | 4.27 | 0.05 | 0.00 | 0.01 | 0.03 | 0.01 | 0.01 | 0.22 | 2 | 0.0022 | 4.39 | 1407 | 1247 |
| 69 | 52.05 | 22.08 | 15.08 | 5.21 | 4.27 | 0.05 | 0.00 | 0.99 | 0.03 | 0.01 | 0.01 | 0.22 | 3 | 0.0021 | 4.39 | 1414 | 1204 |
| 70 | 52.28 | 22.09 | 13.85 | 5.22 | 4.26 | 0.04 | 0.00 | 1.98 | 0.03 | 0.01 | 0.01 | 0.21 | 4 | 0.0020 | 4.39 | 1418 | |

TABLE 8

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 71 | 52.46 | 22.14 | 12.61 | 5.22 | 4.29 | 0.04 | 0.00 | 2.97 | 0.03 | 0.00 | 0.01 | 0.22 | 5 | 0.0020 | 4.39 | 1409 | |
| 72 | 53.80 | 20.69 | 16.36 | 4.23 | 3.20 | 0.98 | 0.00 | 0.45 | 0.03 | 0.01 | 0.01 | 0.22 | 2 | 0.0022 | 4.41 | 1418 | 1294 |
| 73 | 53.93 | 20.88 | 15.04 | 4.22 | 3.19 | 0.98 | 0.00 | 1.48 | 0.03 | 0.03 | 0.01 | 0.22 | 3 | 0.0022 | 4.41 | 1419 | 1226 |
| 74 | 54.37 | 20.60 | 13.79 | 4.24 | 3.22 | 0.98 | 0.00 | 2.54 | 0.03 | 0.01 | 0.01 | 0.22 | 4 | 0.0021 | 4.42 | 1425 | |
| 75 | 54.31 | 20.97 | 12.43 | 4.24 | 3.21 | 0.98 | 0.00 | 3.58 | 0.02 | 0.01 | 0.01 | 0.23 | 5 | 0.0020 | 4.38 | 1426 | |
| 76 | 51.94 | 21.91 | 16.35 | 5.20 | 4.25 | 0.06 | 0.00 | 0.02 | 0.03 | 0.00 | 0.01 | 0.22 | 2 | 0.0022 | 4.36 | 1407 | 1247 |
| 77 | 51.81 | 21.04 | 16.36 | 5.20 | 4.26 | 0.05 | 0.00 | 1.00 | 0.03 | 0.00 | 0.01 | 0.22 | 2 | 0.0023 | 4.45 | 1406 | 1247 |
| 78 | 52.03 | 19.81 | 16.36 | 5.21 | 4.28 | 0.06 | 0.00 | 1.98 | 0.03 | 0.01 | 0.01 | 0.22 | 1 | 0.0023 | 4.45 | 1405 | 1242 |

TABLE 8-continued

| Example # | SiO₂ | B₂O₃ | Al₂O₃ | P₂O₅ | CaO | MgO | SrO | TiO₂ | Fe₂O₃ | Na₂O | K₂O | SnO₂ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 79 | 52.11 | 18.83 | 16.28 | 5.23 | 4.25 | 0.05 | 0.00 | 2.96 | 0.03 | 0.01 | 0.01 | 0.23 | 1 | 0.0023 | 4.53 | 1404 | 1247 |
| 80 | 53.72 | 20.73 | 16.42 | 4.24 | 3.20 | 0.99 | 0.00 | 0.44 | 0.03 | 0.00 | 0.01 | 0.22 | 2 | 0.0023 | 4.43 | 1418 | 1294 |

TABLE 9

| Example # | SiO₂ | B₂O₃ | Al₂O₃ | P₂O₅ | CaO | MgO | SrO | TiO₂ | Fe₂O₃ | Na₂O | K₂O | SnO₂ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 81 | 53.80 | 19.73 | 16.31 | 4.23 | 3.19 | 0.98 | 0.00 | 1.48 | 0.03 | 0.01 | 0.01 | 0.23 | 2 | 0.0023 | 4.46 | 1414 | 1290 |
| 82 | 54.06 | 18.42 | 16.36 | 4.26 | 3.15 | 0.97 | 0.00 | 2.52 | 0.03 | 0.00 | 0.01 | 0.22 | 1 | 0.0024 | 4.53 | 1414 | 1291 |
| 83 | 53.97 | 17.49 | 16.31 | 4.26 | 3.16 | 0.97 | 0.00 | 3.56 | 0.03 | 0.01 | 0.01 | 0.23 | 1 | 0.0024 | 4.56 | 1411 | 1294 |
| 84 | 51.75 | 21.94 | 16.32 | 5.19 | 4.24 | 0.07 | 0.00 | 0.02 | 0.03 | 0.00 | 0.01 | 0.43 | 2 | 0.0022 | 4.40 | 1410 | 1254 |
| 85 | 51.49 | 21.99 | 16.33 | 5.18 | 4.24 | 0.06 | 0.00 | 0.03 | 0.03 | 0.01 | 0.01 | 0.64 | 2 | 0.0022 | 4.39 | 1409 | 1251 |
| 86 | 53.51 | 20.76 | 16.35 | 4.23 | 3.19 | 0.99 | 0.00 | 0.47 | 0.03 | 0.02 | 0.01 | 0.44 | 2 | 0.0022 | 4.41 | 1414 | 1292 |
| 87 | 53.27 | 20.86 | 16.34 | 4.21 | 3.17 | 0.99 | 0.00 | 0.47 | 0.03 | 0.00 | 0.01 | 0.65 | 2 | 0.0023 | 4.44 | 1413 | 1292 |
| 88 | 52.00 | 19.36 | 16.34 | 5.24 | 4.29 | 0.05 | 0.00 | 2.44 | 0.03 | 0.01 | 0.01 | 0.23 | 1 | 0.0023 | 4.54 | 1405 | 1252 |
| 89 | 52.29 | 19.40 | 15.53 | 5.22 | 4.78 | 0.04 | 0.00 | 2.46 | 0.03 | 0.00 | 0.01 | 0.23 | 1 | 0.0024 | 4.47 | 1411 | |
| 90 | 52.28 | 19.70 | 14.71 | 5.24 | 5.26 | 0.06 | 0.00 | 2.47 | 0.03 | 0.01 | 0.01 | 0.23 | 2 | 0.0024 | 4.48 | 1413 | 1136 |

TABLE 10

| Example # | SiO₂ | B₂O₃ | Al₂O₃ | P₂O₅ | CaO | MgO | SrO | TiO₂ | Fe₂O₃ | Na₂O | K₂O | SnO₂ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 91 | 53.52 | 19.93 | 15.69 | 5.22 | 4.62 | 0.05 | 0.00 | 2.51 | 0.03 | 0.01 | 0.01 | 0.22 | 1 | 0.0024 | 4.51 | 1397 | 1247 |
| 92 | 53.69 | 20.05 | 14.89 | 3.23 | 5.32 | 0.05 | 0.00 | 2.51 | 0.03 | 0.00 | 0.01 | 0.22 | 1 | 0.0024 | 4.53 | 1401 | 1186 |
| 93 | 54.01 | 20.02 | 14.09 | 3.24 | 5.82 | 0.05 | 0.00 | 2.51 | 0.03 | 0.01 | 0.01 | 0.21 | 1 | 0.0025 | 4.54 | 1407 | |
| 94 | 52.35 | 16.64 | 15.54 | 5.22 | 3.74 | 0.73 | 0.00 | 2.50 | 0.03 | 0.01 | 0.01 | 0.23 | 2 | 0.0023 | 4.43 | 1410 | 1211 |
| 95 | 52.38 | 19.77 | 15.59 | 5.24 | 2.76 | 1.47 | 0.00 | 2.51 | 0.03 | 0.01 | 0.01 | 0.23 | 3 | 0.0023 | 4.40 | 1408 | 1220 |
| 96 | 52.52 | 19.76 | 14.73 | 5.23 | 4.25 | 0.74 | 0.00 | 2.50 | 0.03 | 0.01 | 0.01 | 0.22 | 2 | 0.0024 | 4.45 | 1414 | 1151 |
| 97 | 52.70 | 19.74 | 14.79 | 5.27 | 3.24 | 1.47 | 0.00 | 2.51 | 0.03 | 0.00 | 0.01 | 0.23 | 3 | 0.0023 | 4.42 | 1414 | 1162 |
| 98 | 54.05 | 19.96 | 14.95 | 3.25 | 4.12 | 0.87 | 0.00 | 2.53 | 0.04 | 0.01 | 0.01 | 0.23 | 2 | 0.0024 | 4.49 | 1403 | 1202 |
| 99 | 54.17 | 20.02 | 15.02 | 3.28 | 2.95 | 1.73 | 0.00 | 2.56 | 0.03 | 0.01 | 0.01 | 0.23 | 3 | 0.0023 | 4.53 | 1402 | 1215 |
| 100 | 54.32 | 20.04 | 14.12 | 3.24 | 4.63 | 0.87 | 0.00 | 2.52 | 0.03 | 0.00 | 0.01 | 0.22 | 2 | 0.0025 | 4.51 | 1408 | |

TABLE 11

| Example # | SiO₂ | B₂O₃ | Al₂O₃ | P₂O₅ | CaO | MgO | SrO | TiO₂ | Fe₂O₃ | Na₂O | K₂O | SnO₂ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 101 | 54.37 | 20.27 | 14.11 | 3.25 | 3.45 | 1.72 | 0.00 | 2.54 | 0.03 | 0.01 | 0.01 | 0.23 | 3 | 0.0024 | 4.46 | 1407 | 155 |
| 102 | 54.79 | 18.99 | 15.77 | 3.23 | 3.46 | 0.99 | 0.00 | 2.51 | 0.03 | 0.00 | 0.01 | 0.22 | 1 | 0.0024 | 4.54 | 1410 | 1284 |
| 103 | 55.96 | 18.03 | 15.00 | 3.25 | 3.95 | 1.00 | 0.00 | 2.54 | 0.03 | 0.01 | 0.01 | 0.23 | 1 | 0.0025 | 4.51 | 1428 | 1219 |
| 104 | 51.58 | 24.12 | 16.22 | 3.94 | 3.78 | 0.05 | 0.00 | 0.05 | 0.03 | 0.00 | 0.01 | 0.21 | 3 | 0.0020 | 4.35 | 1387 | 1307 |
| 105 | 51.45 | 21.65 | 16.36 | 3.94 | 3.79 | 0.04 | 0.00 | 2.49 | 0.03 | 0.01 | 0.01 | 0.22 | 2 | 0.0021 | 4.41 | 1380 | 1300 |
| 106 | 53.54 | 19.57 | 16.35 | 3.94 | 3.78 | 0.06 | 0.00 | 2.51 | 0.03 | 0.01 | 0.01 | 0.22 | 1 | 0.0022 | 4.51 | 1411 | 1307 |
| 107 | 54.86 | 16.11 | 15.57 | 5.27 | 2.24 | 0.03 | 0.00 | 5.41 | 0.03 | 0.01 | 0.01 | 0.45 | 2 | 0.0020 | 4.50 | 1447 | 1336 |
| 108 | 54.78 | 16.34 | 15.48 | 5.35 | 2.24 | 0.04 | 0.00 | 5.27 | 0.03 | 0.00 | 0.01 | 0.45 | 2 | 0.0020 | 4.46 | 1442 | 1333 |
| 109 | 54.46 | 16.57 | 15.58 | 5.22 | 2.27 | 0.04 | 0.00 | 5.37 | 0.03 | 0.01 | 0.01 | 0.44 | 2 | 0.0020 | 4.46 | 1437 | 1331 |
| 110 | 54.16 | 17.01 | 15.48 | 5.21 | 2.24 | 0.04 | 0.00 | 5.36 | 0.03 | 0.01 | 0.01 | 0.45 | 3 | 0.0019 | 4.44 | 1432 | 1328 |

TABLE 12

| Example # | SiO$_2$ | B$_2$O$_3$ | Al$_2$O$_3$ | P$_2$O$_5$ | CaO | MgO | SrO | TiO$_2$ | Fe$_2$O$_3$ | Na$_2$O | K$_2$O | SnO$_2$ | Melt InStability Index (1-6) | Df @ 10 GHz | Dk @ 10 GHz | T3 (° C.) | Liquidus Temperature (° C.) |
|---|---|---|---|---|---|---|---|---|---|---|---|---|---|---|---|---|---|
| 111 | 54.95 | 15.63 | 15.76 | 5.00 | 2.26 | 0.04 | 0.00 | 5.87 | 0.03 | 0.00 | 0.01 | 0.45 | 2 | 0.0020 | 4.49 | 1436 | 1344 |
| 112 | 54.21 | 16.33 | 15.84 | 4.93 | 2.26 | 0.04 | 0.00 | 5.87 | 0.03 | 0.01 | 0.01 | 0.45 | 2 | 0.0020 | 4.47 | 1426 | |
| 113 | 53.81 | 16.08 | 15.88 | 4.75 | 2.54 | 0.04 | 0.00 | 5.97 | 0.03 | 0.01 | 0.01 | 0.90 | 1 | 0.0021 | 4.49 | 1422 | 1341 |
| 114 | 54.31 | 15.92 | 15.67 | 4.81 | 2.46 | 0.05 | 0.00 | 5.84 | 0.03 | 0.01 | 0.01 | 0.89 | 2 | 0.0020 | 4.49 | 1426 | 1333 |
| 115 | 52.86 | 18.97 | 16.42 | 4.59 | 4.03 | 0.04 | 0.00 | 2.80 | 0.03 | 0.00 | 0.01 | 0.23 | 1 | 0.0023 | 4.47 | 1402 | 1278 |
| 116 | 53.42 | 18.54 | 16.11 | 4.60 | 3.50 | 0.04 | 0.00 | 3.42 | 0.03 | 0.00 | 0.01 | 0.32 | 1 | 0.0022 | 4.46 | 1416 | 1294 |
| 117 | 54.02 | 18.50 | 16.00 | 4.00 | 3.25 | 0.04 | 0.00 | 3.75 | 0.03 | 0.00 | 0.01 | 0.40 | 1 | 0.0021 | 4.47 | 1613 | 1323 |
| 118 | 54.95 | 18.26 | 15.76 | 3.57 | 2.97 | 0.04 | 0.00 | 3.96 | 0.03 | 0.00 | 0.01 | 0.45 | 1 | 0.0021 | 4.48 | 1423 | 1332 |
| 119 | 55.59 | 17.07 | 15.68 | 3.59 | 2.49 | 0.04 | 0.00 | 4.90 | 0.03 | 0.00 | 0.01 | 0.58 | 1 | 0.0020 | 4.49 | 1428 | 1354 |
| 120 | 54.66 | 20.00 | 16.00 | 3.50 | 3.50 | 0.04 | 0.00 | 1.75 | 0.03 | 0.00 | 0.01 | 0.90 | 1 | 0.0021 | 4.46 | 1420 | 1318 |

Batches having the sample glass compositions shown in Table 1-12 were prepared as described below. Glass synthesis included batch pre-treatment (mechanical and thermal), a first melting, fritting in water or crushing, a second melting, and, finally, pouring the glass into graphite molds.

Glass specimens were tested for crystallization potential (liquidus temperature) according to ASTM C 829-81.

The T log 3 viscosity temperature was measured using ASTM C 965-81.

Measurements of dielectric characteristics at 10 GHz were performed using the Split Post Dielectric Resonator method, also referred to in the art as the SPDR test.

As shown in Tables 1-12, at 10 GHz, the glass compositions in the examples have a dielectric constant less than 4.56, and a dissipation factor of less than or equal to $25\times10^{-4}$. Specifically, at 10 GHz, the dielectric constant is 4.22 to 4.56, and the dissipation factor is $18\times10^{-4}$ to $25\times10^{-4}$. Accordingly, the glass compositions in the examples exhibited a low dielectric constant and low dissipation factor less than the dielectric properties of E-Glass.

Furthermore, the glass compositions in the examples exhibited T log 3 viscosity temperatures between 1374° C. to 1447° C., which is similar to typical T log 3 viscosity temperatures of D-Glass (around 1400° C.). Having a T log 3 viscosity temperature greater than 1350° C. is favorable for fiberizing a glass composition according to the present invention. Thus, the glass composition according to the examples, and according to embodiments of the invention, is greater than 1350° C.

Additionally, the glass compositions in the examples exhibited a liquidus temperature between 1136° C. to 1374° C. Having a liquidus temperature greater than 1100° C., or in some embodiments greater than 1150° C., is satisfactory for fiberizing a glass composition according to the present invention. Thus, the glass composition according to the examples and according to embodiments of the invention is greater than 1100° C.

INDUSTRIAL APPLICABILITY

The glass fibers of the present invention have low dielectric constants and low dissipation factors and are excellent as a glass fiber for printed wiring boards. The glass fibers are particularly well suited for reinforcing printed wiring boards for high-density circuits used in high speed routing systems. Furthermore, the glass compositions used to make fibers of the present invention have excellent workability. Therefore, a stable low dielectric glass fiber can be readily produced.

A variety of base materials containing the glass fiber of the present invention can be produced, including, but not limited to, woven fabrics, non-woven fabrics, unidirectional fabrics, knitted products, chopped strand, roving, filament wound products, glass powder, and mats. Composite materials formed from at least one of these base materials and a plastic resin matrix (such as thermoset plastic, compounded thermoplastic, a sheet molding compound, a bulk molding compound, or a prepeg) also can be used as reinforcements for peripheral communication devices, and the like. For example, a composite material that includes glass fibers according to the invention can be used in radar transparency applications at frequencies ranging from about 300 MHz to about 30 GHz.

The disclosed and described processes relate to glass fibers, which can be obtained by mechanically attenuating streams of molten glass that flow out of orifices located in the base of a fiberizing bushing, which is powered by resistance heating or other means. These glass fibers may be intended especially for the production of meshes and fabrics used in composites having an organic and/or inorganic matrix.

As required, detailed embodiments of the present invention are disclosed herein; however, it is to be understood that the disclosed embodiments are merely exemplary of the invention that may be embodied in various and alternative forms. Therefore, specific structural and functional details disclosed herein are not to be interpreted as limiting, but merely as a basis for the claims and as a representative basis for teaching one skilled in the art to variously employ the present invention. It will be apparent to those skilled in the art that many changes and substitutions may be made to the foregoing description of preferred embodiments and examples without departing from the spirit and scope of the present invention, which is defined by the appended claims.

While various embodiments and examples of this invention have been described above, these descriptions are given for purposes of illustration and explanation. Variations, changes, modifications, and departures from the embodiments, systems, and methods disclosed above may be adopted without departure from the spirit and scope of this invention.

What is claimed is:

1. A glass composition comprising:
   between 48.0 to 57.0 weight percent SiO$_2$;
   between 15.0 and 26.0 weight percent B$_2$O$_3$;
   between 12.0 and 18.0 weight percent Al$_2$O$_3$;
   between 3.0 and 8.0 weight percent P$_2$O$_5$;
   between 0.25 and 7.0 weight percent CaO;
   5.0 or less weight percent MgO; and,
   Greater than 0.5 to 6.0 weight percent TiO$_2$;

wherein the composition has a glass viscosity of 1000 poise at a temperature greater than 1350° C., and
wherein the composition has a liquidus temperature greater than 1100° C.

2. The glass composition of claim 1, wherein the glass composition further comprises:
between 49.0 to 56.5 weight percent $SiO_2$;
between 15.5 to 25.5 weight percent $B_2O_3$;
between 12.5 and 17.50 weight percent $Al_2O_3$;
between 3.0 and 7.5 weight percent $P_2O_5$;
between 0.25 and 6.5 weight percent CaO;
4.5 or less weight percent MgO; and
5.5 or less weight percent $TiO_2$.

3. The glass composition of claim 1, wherein the glass composition further comprises:
between 50.0 to 56.0 weight percent $SiO_2$;
between 16.0 to 25.0 weight percent $B_2O_3$;
between 13.0 and 17.0 weight percent $Al_2O_3$;
between 3.0 and 7.0 weight percent $P_2O_5$;
between 0.25 and 6.0 weight percent CaO;
4.0 or less weight percent MgO; and
5.0 or less weight percent $TiO_2$.

4. The glass composition of claim 1, wherein the composition further comprises one or more of:
no less than 49.0 weight percent $SiO_2$;
no more than 56.5 weight percent $SiO_2$;
no less than 15.5 weight percent $B_2O_3$;
no more than 25.5 weight percent $B_2O_3$;
no more than 17.50 weight percent $Al_2O_3$;
no more than 7.0 weight percent $P_2O_5$;
6.5 or less weight percent CaO;
4.5 or less weight percent MgO; and/or
no more than 5.5 weight percent $TiO_2$.

5. The glass composition of claim 1, wherein the composition further comprises one or more of:
no less than 50.0 weight percent $SiO_2$;
no more than 56.0 weight percent $SiO_2$;
no less than 16.0 weight percent $B_2O_3$;
no more than 25.0 weight percent $B_2O_3$;
no more than 17.0 weight percent $Al_2O_3$;
no more than 7.0 weight percent $P_2O_5$;
6.0 or less weight percent CaO;
4.0 or less weight percent MgO; and/or
no more than 5.0 weight percent $TiO_2$.

6. The glass composition of claim 1, wherein the glass composition has an inherent network structure that is predisposed to crystalize into and form Alumino-Borate Mullite crystals.

7. A process for providing continuous, manufacturable low dielectric glass fibers, the process comprising the steps of:
providing the glass composition of claim 1 to a melting zone of a glass melter;
heating the composition to a forming temperature in excess of the liquidus temperature; and
continuously fiberizing said molten glass whereby a low dielectric constant and low dissipation factor glass fiber is produced.

8. A low dielectric glass fiber formed from a glass composition comprising:
between 48.0 to 57.0 weight percent $SiO_2$;
between 15.0 and 26.0 weight percent $B_2O_3$;
between 12.0 and 18.0 weight percent $Al_2O_3$;
between 3.0 and 8.0 weight percent $P_2O_5$;
between 0.25 and 7.00 weight percent CaO;
5.0 or less weight percent MgO; and
greater than 0.5 to 6.0 weight percent $TiO_2$;
wherein the composition has a glass viscosity of 1000 poise at a temperature greater than 1350° C., and
wherein the glass composition has a liquidus temperature greater than 1100° C.

9. The low dielectric glass fiber of claim 8, wherein the glass composition further comprises:
between 49.0 to 56.5 weight percent $SiO_2$;
between 15.5 to 25.5 weight percent $B_2O_3$;
between 12.5 and 17.50 weight percent $Al_2O_3$;
between 3.0 and 7.5 weight percent $P_2O_5$;
between 0.25 and 6.5 weight percent CaO;
4.5 or less weight percent MgO; and
5.5 or less weight percent $TiO_2$.

10. The low dielectric glass fiber of claim 8, wherein the glass composition further comprises:
between 50.0 to 56.0 weight percent $SiO_2$;
between 16.0 to 25.0 weight percent $B_2O_3$;
between 13.0 and 17.0 weight percent $Al_2O_3$;
between 3.0 and 7.0 weight percent $P_2O_5$;
between 0.25 and 6.0 weight percent CaO;
4.0 or less weight percent MgO; and
5.0 or less weight percent $TiO_2$.

11. The low dielectric glass fiber of claim 8, wherein the glass composition further comprises one or more of:
no less than 49.0 weight percent $SiO_2$;
no more than 56.5 weight percent $SiO_2$;
no less than 15.5 weight percent $B_2O_3$;
no more than 25.5 weight percent $B_2O_3$;
no more than 17.50 weight percent $Al_2O_3$;
no more than 7.0 weight percent $P_2O_5$;
6.5 or less weight percent CaO;
4.5 or less weight percent MgO; and/or
no more than 5.5 weight percent $TiO_2$.

12. The low dielectric glass fiber of claim 8, wherein the glass composition further comprises one or more of:
no less than 50.0 weight percent $SiO_2$;
no more than 56.0 weight percent $SiO_2$;
no less than 16.0 weight percent $B_2O_3$;
no more than 25.0 weight percent $B_2O_3$;
no more than 17.0 weight percent $Al_2O_3$;
no more than 7.0 weight percent $P_2O_5$;
6.0 or less weight percent CaO;
4.0 or less weight percent MgO; and/or
no more than 5.0 weight percent $TiO_2$.

13. The glass fiber of claim 8, wherein the glass fiber has a dielectric constant less than or equal to 6 and/or a dissipation factor less than or equal to $38 \times 10^{-4}$ at a frequency of 10 GHz at room temperature.

14. The glass fiber of claim 8, wherein the glass fiber has a dielectric constant less than or equal to 4.60 and/or a dissipation factor less than or equal to $30 \times 10^{-4}$ at a frequency of 10 GHz at room temperature.

15. The glass fiber of claim 8, wherein the glass fiber has a dielectric constant less than or equal to 4.55 and/or a dissipation factor less than or equal to $25 \times 10^{\times 4}$ at a frequency of 10 GHz at room temperature.

16. A fiberglass reinforced article comprising the glass fibers of claim 8.

17. The fiberglass reinforced article of claim 16, wherein the article is a printed circuit board.

18. The glass fiber of claim 8, wherein the glass fiber is formed from a glass composition which has an inherent network structure that is predisposed to crystalize into and form Alumino-Borate Mullite crystals.

19. A product comprising the glass fiber according to claim 8, the product being selected from the group consisting of a printed circuit board, a woven fabric, a non-woven fabric, a unidirectional fabric, a chopped strand, a chopped strand mat, a composite material, and a communication signal transport medium.

\* \* \* \* \*